(12) United States Patent
Fjelstad

(10) Patent No.: US 8,404,977 B2
(45) Date of Patent: Mar. 26, 2013

(54) FLEXIBLE CIRCUIT ASSEMBLY WITHOUT SOLDER

(75) Inventor: Joseph C Fjelstad, Maple Valley, WA (US)

(73) Assignee: Occam Portfolio LLC, Cupertino, CA (US)

( * ) Notice: Subject to any disclaimer, the term of this patent is extended or adjusted under 35 U.S.C. 154(b) by 0 days.

(21) Appl. No.: 13/458,167

(22) Filed: Apr. 27, 2012

(65) Prior Publication Data

US 2012/0211265 A1    Aug. 23, 2012

Related U.S. Application Data

(60) Division of application No. 12/581,711, filed on Oct. 19, 2009, now Pat. No. 8,193,042, and a continuation of application No. PCT/US2008/063123, filed on May 8, 2008.

(60) Provisional application No. 61/106,398, filed on Oct. 17, 2008, provisional application No. 60/928,467, filed on May 8, 2007, provisional application No. 60/932,200, filed on May 29, 2007, provisional application No. 60/958,385, filed on Jul. 5, 2007, provisional application No. 60/959,148, filed on Jul. 10, 2007, provisional application No. 60/962,626, filed on Jul. 31, 2007, provisional application No. 60/963,822, filed on Aug. 6, 2007, provisional application No. 60/966,643, filed on Aug. 28, 2007, provisional application No. 61/038,564, filed on Mar. 21, 2008, provisional application No. 61/039,059, filed on Mar. 24, 2008.

(51) Int. Cl.
*H05K 1/02* (2006.01)
*H05K 1/00* (2006.01)
(52) U.S. Cl. ......... 174/251; 174/254; 174/260; 174/261
(58) Field of Classification Search ................. 174/251, 174/254, 260, 261; 257/698, 686
See application file for complete search history.

(56) References Cited

U.S. PATENT DOCUMENTS

| | | | | |
|---|---|---|---|---|
| 5,750,926 A | * | 5/1998 | Schulman et al. | 174/564 |
| 5,831,836 A | * | 11/1998 | Long et al. | 361/820 |
| 6,225,688 B1 | * | 5/2001 | Kim et al. | 257/686 |
| 6,590,283 B1 | * | 7/2003 | Zolnowski | 257/698 |
| 6,600,222 B1 | * | 7/2003 | Levardo | 257/686 |
| 2004/0113253 A1 | * | 6/2004 | Karnezos | 257/686 |

* cited by examiner

*Primary Examiner* — Angel R Estrada
*Assistant Examiner* — Dimary Lopez
(74) *Attorney, Agent, or Firm* — Edward P. Heller, III

(57) ABSTRACT

Provided is a flexible electronic assembly that uses no solder. Components or component packages are mounted on a flexible substrate. Vias connect through the substrate to the components' leads. Circuits are formed on the opposite side of the substrate interconnecting the component through the vias. The assembly is made flexible by removing encapsulent material between components.

3 Claims, 9 Drawing Sheets

1100

FLEXIBLE CIRCUIT ASSEMBLY WITHOUT SOLDER

This application is a divisional application of U.S. patent application Ser. No. 12/581,711, filed 19 Oct. 2009, which application claimed the benefit of and priority to "FLEXIBLE CIRCUIT ASSEMBLIES WITHOUT SOLDER AND METHODS FOR THEIR MANUFACTURE," U.S. Application No. 61/106,398 filed on Oct. 17, 2008, both of which are hereby incorporated by reference in their entirety.

A application Ser. No. 12/581,711, filed 19 Oct. 2009 is a continuation application of PCT Application No. PCT/US08/63123 filed on May 8, 2008 which claimed priority to: "ELECTRONIC ASSEMBLY WITHOUT SOLDER," U.S. Application No. 60/928,467, filed on May 8, 2007; "ELECTRONIC ASSEMBLY WITHOUT SOLDER AND METHODS FOR THEIR MANUFACTURE," U.S. Application No. 60/932,200, filed on May 29, 2007; "SOLDERLESS FLEXIBLE ELECTRONIC ASSEMBLIES AND METHODS FOR THEIR MANUFACTURE," U.S. Application No. 60/958,385, filed on Jul. 5, 2007; "ELECTRONIC ASSEMBLIES WITHOUT SOLDER AND METHODS FOR THEIR MANUFACTURE," U.S. Application No. 60/959,148, filed on Jul. 10, 2007; "MASS ASSEMBLY OF ENCAPULSATED ELECTRONIC COMPONENTS TO A PRINTED CIRCUIT BOARD BY MEANS OF AN ADHESIVE LAYER HAVING EMBEDDED CONDUCTIVE JOINING MATERIALS," U.S. Application No. 60/962,626, filed on Jul. 31, 2007; "SYSTEM FOR THE MANUFACTURE OF ELECTRONIC ASSEMBLIES WITHOUT SOLDER," U.S. Application No. 60/963,822, filed on Aug. 6, 2007; "ELECTRONIC ASSEMBLIES WITHOUT SOLDER AND METHODS FOR THEIR MANUFACTURE," U.S. Application No. 60/966,643, filed on Aug. 28, 2007; "MONOLITHIC MOLDED SOLDERLESS FLEXIBLE ELECTRONIC ASSEMBLIES AND METHODS FOR THEIR MANUFACTURE," U.S. Application No. 61/038,564, filed on Mar. 21, 2008; and "THE OCCAM PROCESS SOLDERLESS ASSEMBLY AND INTERCONNECTION OF ELECTRONIC PACKAGES," U.S. Application No. 61/039,059, filed on Mar. 24, 2008.

COPYRIGHT NOTICE/PERMISSION

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD OF THE INVENTION

The present invention relates generally to the field of electronic assembly and more specifically, but not exclusively, to the manufacture and assembly of electronic products without the use of solder.

BACKGROUND

The assembly of electronic products and more specifically the permanent assembly of electronic components to printed circuit boards have involved the use of some form of relatively low-temperature solder alloy (e.g., tin/lead or Sn63/Pb37) since the earliest days of the electronics industry. The reasons are manifold but the most important one has been the ease of mass joining of thousand of electronics interconnections between printed circuit and the leads of many electronic components.

Lead is a highly toxic substance, exposure to which can produce a wide range of well known adverse health effects. Of importance in this context, fumes produced from soldering operations are dangerous to workers. The process may generate a fume which is a combination of lead oxide (from lead based solder) and colophony (from the solder flux). Each of these constituents has been shown to be potentially hazardous. In addition, if the amount of lead in electronics were reduced, it would also reduce the pressure to mine and smelt it. Mining lead can contaminate local ground water supplies. Smelting can lead to factory, worker, and environmental contamination.

Reducing the lead stream would also reduce the amount of lead in discarded electronic devices, lowering the level of lead in landfills and in other less secure locations. Because of the difficulty and cost of recycling used electronics, as well as lax enforcement of legislation regarding waste exports, large amounts of used electronics are sent to countries such as China, India, and Kenya, which have lower environmental standards and poorer working conditions.

Thus, there are marketing and legislative pressures to reduce tin/lead solders. In particular, the Directive on the Restriction of the Use of Certain Hazardous Substances in Electrical and Electronic Equipment (commonly referred to as the Restriction of Hazardous Substances Directive or RoHS) was adopted in February 2003 by the European Union. The RoHS directive took effect on Jul. 1, 2006, and is required to be enforced and become law in each member state. This directive restricts the use of six hazardous materials, including lead, in the manufacture of various types of electronic and electrical equipment. It is closely linked with the Waste Electrical and Electronic Equipment Directive (WEEE) 2002/96/EC which sets collection, recycling and recovery targets for electrical goods and is part of a legislative initiative to solve the problem of huge amounts of toxic electronic device waste.

RoHS does not eliminate the use of lead in all electronic devices. In certain devices requiring high reliability, such as medical devices, continued use of lead alloys is permitted. Thus, lead in electronics continues to be a concern. The electronics industry has been searching for a practical substitute for tin/lead solders. The most common substitutes in present use are SAC varieties, which are alloys containing tin (Sn), silver (Ag), and copper (Cu).

SAC solders also have significant environmental consequences. For example, mining tin is disastrous both locally and globally. Large deposits of tin are found in the Amazon rain forest. In Brazil, this has led to the introduction of roads, clearing of forest, displacement of native people, soil degradation, and creation of dams, tailing ponds, and mounds, and smelting operations. Perhaps the most serious environmental impact of mining tin in Brazil is the silting up of rivers and creeks. This degradation modifies forever the profile of animal and plant life, destroys gene banks, alters the soil structure, introduces pests and diseases, and creates an irrecoverable ecological loss.

Worldwide ecological problems stemming from mismanagement of Brazil's environment are well known. These range from pressures on global warming from the destruction of rain forest to the long term damage to the pharmaceutical industry by the destruction of animal and plant life diversity. Mining in Brazil is simply one example of the tin industry's destructive effects. Large deposits and mining operations also exist in Indonesia, Malaysia, and China, developing countries where attitudes toward economic development overwhelm concerns for ecological protection.

SAC solders have additional problems. They require high temperatures, wasting energy, are brittle, and cause reliability problems. The melting temperature is such that components and circuit boards may be damaged. Correct quantities of individual alloy constituent compounds are still under investigation and the long term stability is unknown. Moreover, SAC solder processes are prone to the formation of shorts (e.g., "tin whiskers") and opens if surfaces are not properly prepared. Whether tin/lead solder or a SAC variety is used, dense metal adds both to the weight and height of circuit assemblies.

Therefore there is a need for a substitute for the soldering process and its attendant environmental and practical drawbacks.

While solder alloys have been most common, other joining materials have been proposed and/or used such as so-called "polymer solders" which are a form of conductive adhesive. Moreover, there have been efforts to make connections separable by providing sockets for components. There have also been electrical and electronic connectors developed to link power and signal carrying conductors described with various resilient contact structures all of which require constant applied force or pressure.

At the same time, there has been a continual effort to put more electronics into ever smaller volumes. As a result, over the last few years there has been interest within the electronics industry in various methods for integrated circuit (IC) chip stacking within packages and the stacking of IC packages themselves, all with the intent of reducing assembly size in the Z or vertical axis. There has also been an ongoing effort to reduce the number of surface mounted components on a printed circuit board (PCB) by embedding certain components, mostly passive devices, inside the circuit board.

In the creation of IC packages, there has also been an effort to embed active devices by placing unpackaged IC devices directly inside a substrate and interconnecting them by drilling and plating directly to the chip contacts. While such solutions offer benefits in specific applications, the input/output (I/O) terminals of the chip can be very small and very challenging to make such connections accurately. Moreover the device after manufacturing may not successfully pass burn in testing making the entire effort valueless after completion.

Another area of concern is in management of heat as densely packaged ICs may create a high energy density that can reduce the reliability of electronic products.

SUMMARY OF THE INVENTION

The present invention provides an electronic assembly and a method for its manufacture. Pre-tested and burned in components including electrical, electronic, electro-optical, electro-mechanical and user interface devices with external I/O contacts are placed onto a planar base. The assembly is encapsulated with a solder mask, dielectric, or electrically insulating material (collectively referred to as "insulating material" in this application including claims) with holes, known as vias, formed or drilled through to the components' leads, conductors, and terminals (collectively referred to as "leads" in this application including claims). Then the assembly is plated and the encapsulation and drilling process repeated to build up desired layers.

The assembly, built with a novel reverse-interconnection process (RIP), uses no solder, thus bypassing the use of lead, tin, and heat associated problems. The term "reverse" refers to the reverse order of assembly; components are placed first and then circuit layers manufactured rather than creating a PCB first and then mounting components. No conventional PCB is required (although one may be optionally integrated), shortening manufacturing cycle time, reducing costs and complexity, and lessening PCB reliability problems.

RIP products are robust with respect to mechanical shock and thermal cycle fatigue failure. In comparison to conventional products placed on PCB boards, components incorporated into RIP products require no standoff from the surface and thus have a lower profile and can more densely spaced. Moreover, because no solderable finish is required and fewer materials and fewer process steps are required, RIP products are lower-cost. In addition, RIP products are amenable to in-place thermal enhancements (including improved heat dissipation materials and methods) that also may provide integral electromagnetic interference (EMI) shielding. Moreover the structure may be assembled with embedded electrical and optical components.

The present invention overcomes numerous disadvantages in the prior art by:
Obviation of the need for circuit boards
Obviation of the need for soldering
Obviation of the problem of "tin whiskers"
Obviation of the need for difficult cleaning between fine pitch component leads and beneath the components
Obviation of the need for compliant leads or compliant solder connections
Obviation of many of the problems associated with electronic waste at many different levels of manufacturing and end of life
Obviation of the thermal concerns related to the use of high temperature lead-free solders on vulnerable components
Benefits of the present invention include:
Low manufacturing waste, as structures are almost completely additive
Lower material use in construction
Environmentally friendly as potentially toxic metals are not needed
Fewer processing steps
Reduced testing requirements
Low heat processing, thus resulting in energy savings
Lower cost
Lower profile assemblies
Increased reliability
Potentially higher performance or longer battery life
Better protection of ICs against mechanical shock, vibration and physical damage
Full shielding of the electronics as a final metal coating can be applied
Improved thermal performance
Integral edge card connector capable
Improved design for memory modules
Improved design for phone modules
Improved design for computer card modules
Improved design for smart and RFID cards
Improved design for electro-optical assemblies
Improved lighting modules The details of the present invention, both as to its structure and operation, and many of the attendant advantages of this invention, can best be understood in reference to the following detailed description, when taken in conjunction with the accompanying drawings, in which like reference numerals refer to like parts throughout the various views unless otherwise specified, and in which:

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, the interconnection between conductor elements of components (i.e., component I/O leads including electro-optical ports) may be shown or described as having multi-conductors interconnecting to a single lead or a single conductor signal line connected to multiple component contacts within or between devices. Thus each of the multi-conductor interconnections may alternatively be a single-conductor signaling, control, power or ground line and vice versa. Circuit paths shown or described as being single-ended may also be differential, and vice-versa. The interconnected assembly may be comprised of standard interconnections; microstrip or stripline interconnections and all signal lines of the assembly may be either shielded or unshielded.

Figure 1:
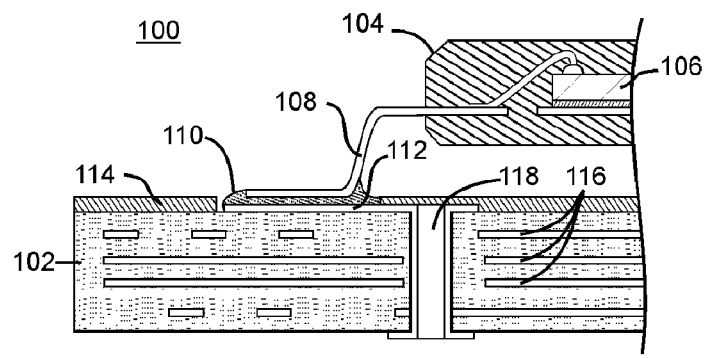
FIG. 1 is a cross-sectional view of a prior solder assembly employing a gull wing component on a PCB.

FIG. 1 shows a prior completed assembly 100, with solder joint 110, of a gull wing component package 104 solder-mounted on a PCB 102.

Component package 104 contains electrical component 106. The component 106 may be either an IC or another discrete component. Gull wing lead 108 extends from package 104 to flow solder 110 which in turn connects lead 108 to pad 112 on PCB 102. Insulating material 114 prevents flow solder 110 from flowing to and shorting component 106 with other components (not shown) on PCB 102. Pad 112 connects to through hole 118 which in turn connects to proper traces such as ones indicated by 116. In addition to the aforementioned problems with solder joints, this type of assembly, including the internal structure of PCB 102, is complex and requires height space that is reduced in the present invention.

Figure 2:
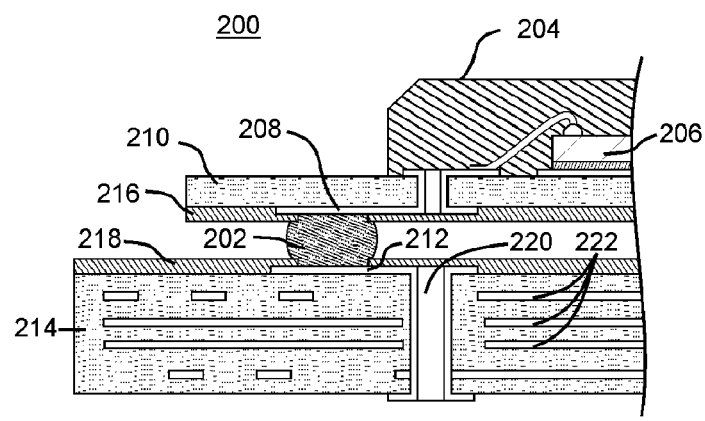
FIG. 2 is a cross-sectional view of a prior solder assembly employing either a Ball Grid Array (BGA) or a Land Grid Array (LGA) component on a PCB.

FIG. 2 shows a prior completed assembly 200, with solder joint 202, of either a BGA IC or a LGA IC package 204 on a PCB 214. A primary difference from FIG. 1 is the use of ball solder 202 as opposed to flow solder 110.

Component package 204 contains component 206. Lead 208 extends from package 204 through support 210 (typically composed of organic or ceramic material) to ball solder 202 which in turn connects lead 208 to pad 212 on PCB 214. Insulating material 216 prevents ball solder 202 from shorting other leads (not shown) contained in package 204. Insulating material 218 prevents ball solder 202 from flowing to and shorting component 206 with other components (not shown) on PCB 214. Pad 212 connects to through hole 220 which in turn connects to proper traces such as ones indicated by 222. The same problems are present with this configuration as with the assembly shown in FIG. 1: In addition to the aforementioned problems with solder joints, this type of assembly is complex, particularly because of the PCB 214, and requires height space that is reduced in the present invention.

Figure 3:
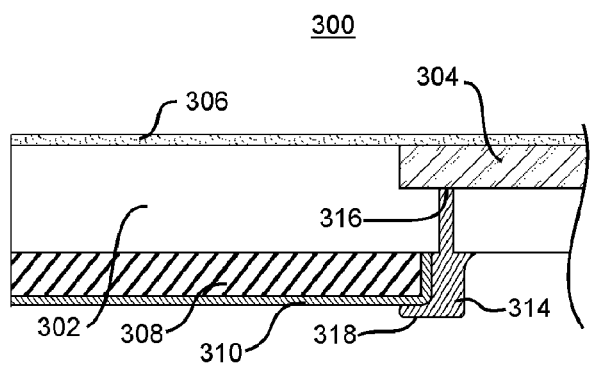
FIG. 3 is a cross-sectional view of a prior solderless assembly employing an electrical component.

FIG. 3 illustrates a prior solderless connection apparatus 300. See U.S. Pat. No. 6,160,714 (Green). In this configuration, substrate 302 supports a package 304. Package 304 contains an electrical component (not shown) such as an IC or other discrete component. Overlying substrate 302 is insulating material 306. On the other side of the substrate 302, is a conductive, polymer-thick-film ink 308. To improve conductivity, a thin film of copper is plated 310 on polymer-thickfilm 308. A via extends from the package 304 through substrate 302. The via is filled with a conductive adhesive 314. The point of attachment 316 of package 304 to adhesive 314 may be made with fusible polymer-thick-film ink, silver polymer-thick-film conductive ink, or commercial solder paste. One disadvantage of this prior art assembly over the present invention is the additional thickness added by the adhesive 314 as illustrated by bump 318.

RIP Apparatus

Figure 4:
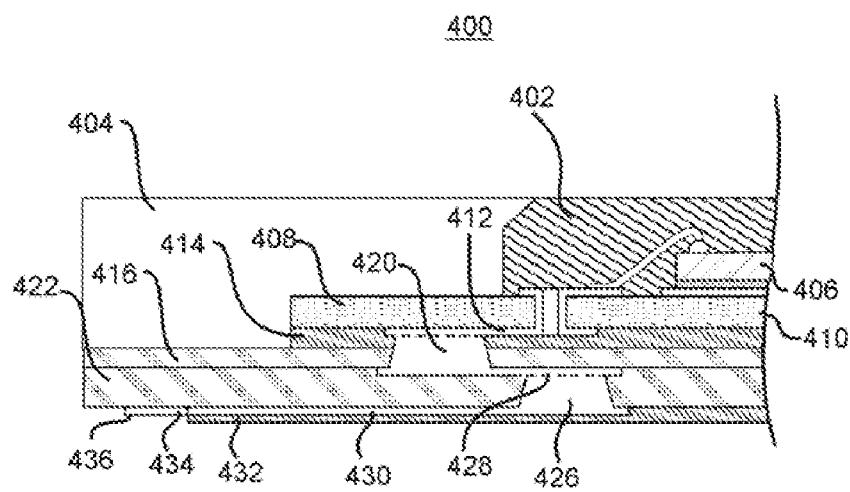
FIG. 4 is a cross-sectional view of a portion of a RIP assembly employing a LGA component.

FIG. 4, an apparatus 400 illustrative of the present invention, shows a LGA component package (402, 406, 408, 410, 412, 414) mounted on a substrate 416 which does not have to be a PCB. It will be obvious to one skilled in the art that a BGA, gull wing, or other IC package structure or any type of discrete component may substitute for the LGA component. The connection is simpler, solder free, and lower profile than the assemblies shown in FIGS. 1, 2, and 3.

Adhering to package 402 is electrically insulating material 404. Material 404 is shown attached to 1 side of package 402. However, material 404 may be attached to 2 sides of package 402, more than 2 sides of package 402, or may in fact envelop package 402. As applied, material 404 may give the apparatus strength, stability, structural integrity, toughness (i.e., it is non-brittle), and dimensional stability. Material 404 may be reinforced by the inclusion of a suitable material such as a glass cloth.

Component package 402 contains electrical component 406 (such as an IC, discrete, or analog device; collectively referred to as "component" in this application including claims), supports 408 and 410 (preferably composed of organic or ceramic material), lead 412, and insulating material 414. While component package 402, as manufactured and shipped in many cases, incorporates insulating material 414, this legacy feature may potentially be eliminated in the future thus reducing the profile of the assembly 400. Either supports 408 and 410 or, if present, insulating material 414 sit on substrate 416 which is preferably made of insulating material. Some portion or all of substrate 416 may be made of electrically conductive material if it is desired to short leads (e.g., 412) extending from package 402.

Attachment of lead 412 to insulating material 414 and substrate 416 may be realized by adhesive dots as well as by other well known techniques.

A first set of vias, an example of which is via 420, extends through substrate 416, extends through insulating material 414, if present, reaches, and exposes leads such as lead 412. The vias 420 are plated or filled with an electrically conductive material (in many cases copper (Cu), although silver (Ag), gold (Au), or aluminum (Al) as well as other suitable materials, may be substituted). The plate or fill fuse with leads 412 forming an electrical and mechanical bond.

The substrate 416 may include a pattern mask (not shown) which is plated, or the plate or fill introduced into the first set of vias (e.g., via 420) may extend under the substrate 416 and provide a required first set of traces. Other traces may be created. A layer 422, also of insulating material, may underlay substrate 416 and first traces. The purpose of 422 is to provide a platform for a second set of traces (if required) and to electrically insulate the first set of traces from the second set of traces.

A second set of vias, an example of which is via 426, extends through layer 422, reaches, and exposes traces and/or leads (e.g., lead 428) under substrate 416. As discussed above, referring to the first set of vias (e.g., via 420), the second set of vias may be plated or filled so that they fuse with desired leads (e.g., lead 428) under substrate 416. As above, one or more traces 430 may extend under layer 422.

This layering continues as needed. By repeating the above structure, multiple layers (not shown), and additional traces and vias may be built. A surface insulating material 432 under coats the last layer. Leads or electrical connectors (e.g., lead 434) may extend beyond the surface insulating material 432. This provides contact surfaces (e.g., surface 436) to permit connection with other electrical components or circuit boards.

Figure 5:
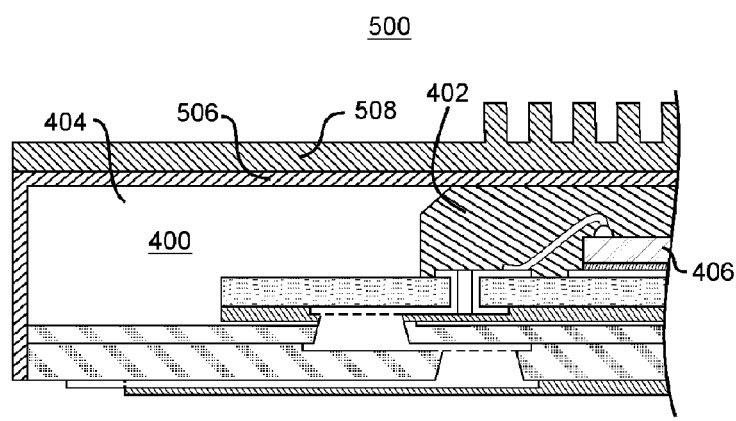
FIG. 5 is a cross-sectional view of a portion of a RIP assembly employing a LGA component with an optional heat spreader and heat sink.

FIG. 5, apparatus 500, shows optional heat dissipation features. Subassembly 400, previously described in FIG. 4, may have on top of the package 402 and material 404 a heat spreader 506 and/or a heat sink 508 to dissipate heat generated by component 406. A thermal interface material (not shown) may be used to join the heat sink to the heat spreader. Optionally, material 404 may include in its composition a heat conductive (although electrically insulating) material such as silicon dioxide ($SiO_2$) or aluminum dioxide ($AlO_2$) to enhance heat flow from package 402. If heat spreader 506 and heat sink 508 are made of one or more substances well known in the art, they may provide electromagnetic interference (EMI) protection to the subassembly 400 and help protect against static electricity discharges.

Figure 6:
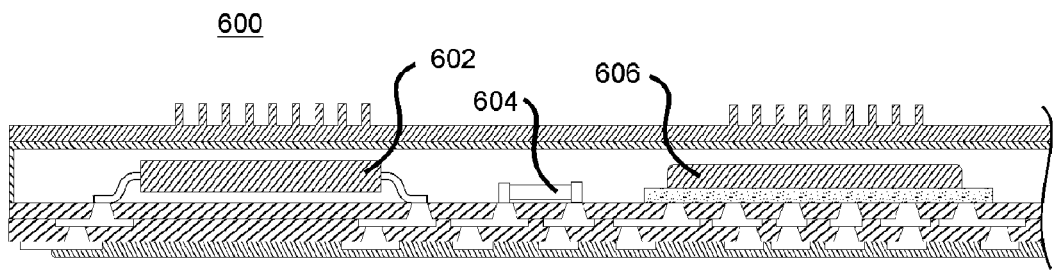
FIG. 6 is a cross-sectional view of a two layer RIP assembly showing mounted discrete, analog, and LGA components.

In accordance with a two layer RIP apparatus, a section of which is shown in FIG. 5, FIG. 6 shows apparatus 600 with a mounted sample set of components, including a discrete gull wing component 602, an analog component 604, and a LGA IC 606.

It will be apparent to someone skill in the art that the RIP apparatus is less complicated than a PCB containing soldered components. That is, just a PCB by itself is a complex device requiring dozens of steps to manufacture. The RIP apparatus, by not requiring a PCB board, is simpler and requires fewer steps to manufacture a complete electronic assembly.

Figure 7:
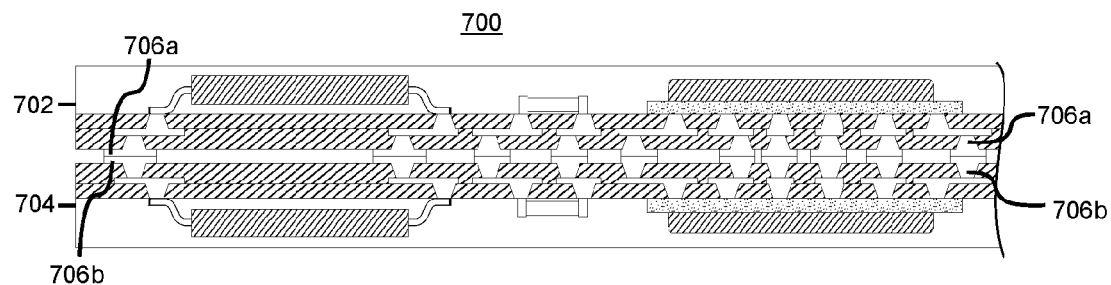
FIG. 7 is a cross-sectional view of a pair of mated two layer RIP subassemblies.

As an option, the FIG. 7 apparatus 700 shows two RIP subassemblies, 702 and 704, joined together at the plated and/or filled vias (e.g., 706a, 706b) and/or at the leads (e.g., 708a, 708b).

RIP Method of Manufacture

FIGS. 8 to 17 show a method of manufacture of a RIP assembly. It will be apparent to one skilled in the art that the sequence of steps may be varied without departing from the scope and spirit of this invention.

Figure 8:
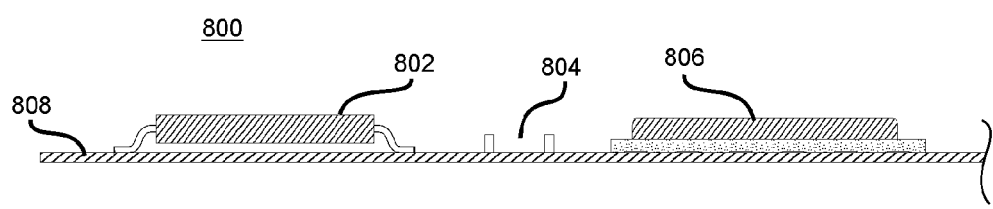
FIG. 8 is a cross-sectional view of a stage in the manufacture of a representative RIP assembly.

FIG. 8, stage 800, shows the initial mounting of packaged components, 802, 804, and 806 on a substrate 808. The components may be held in place by a number of different techniques and/or substances well known in the art including applying spot or conductive adhesive or by bonding to a tacky film of component leads to substrate 808. The material for applying or bonding may be suitable for holding and later releasing the components.

Figure 9:
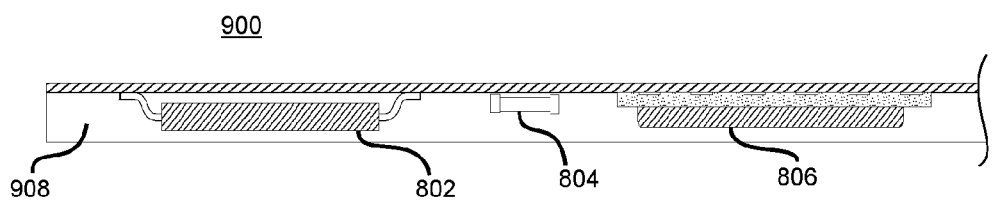
FIG. 9 is a cross-sectional view of a stage in the manufacture of a representative RIP assembly.

FIG. 9, stage 900, shows another step in the RIP method of manufacture. At this stage, the partial apparatus of FIG. 8 is flipped. The initially mounted packaged components 802, 804, and 806 are encased in electrically insulating material 908. Material 908 provides support for packaged components 802, 804, and 806 as well as electrical insulation from each other. If material 908 contains heat conductive, but electrically insulating matter, such as $AlO_2$ or $SiO_2$, it will also aid in dissipating heat.

Figure 10:
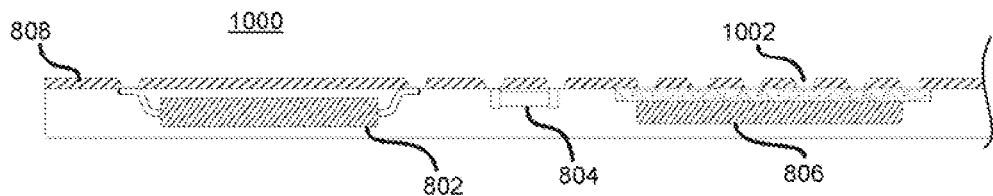
FIG. 10 is a cross-sectional view of a stage in the manufacture of a representative RIP assembly.

FIG. 10, stage 1000, shows another step in the RIP method of manufacture. Vias (e.g., 1002) through substrate 808 are created, reaching and exposing leads of packaged components 802, 804, and 806. Vias (e.g., 1002) may be formed or drilled (collectively referred to as "formed" in this application including claims) by any number of known techniques including laser drilling.

Figure 11:
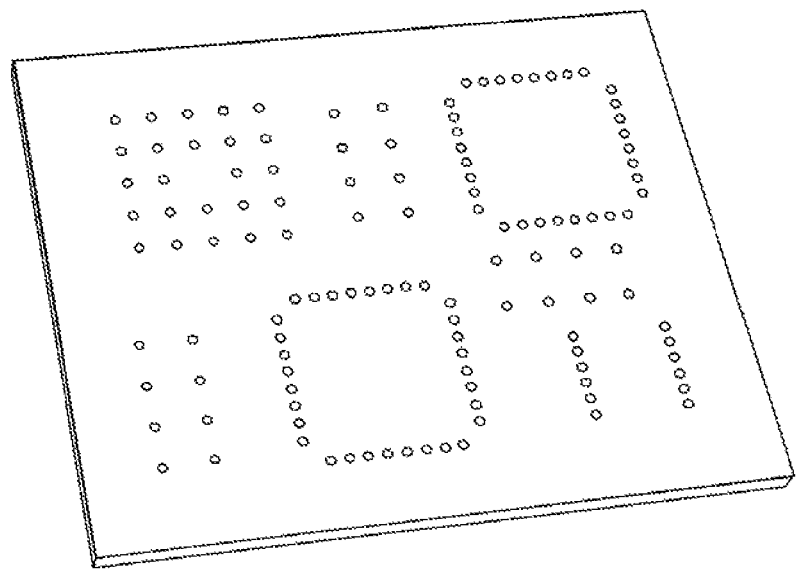
FIG. 11 is a perspective representation of a RIP subassembly.

FIG. 11, partial assembly 1100, as shown at the completion of stage 1000, is a perspective view of a top side of substrate 808 showing vias (e.g., 1102).

Figure 12:
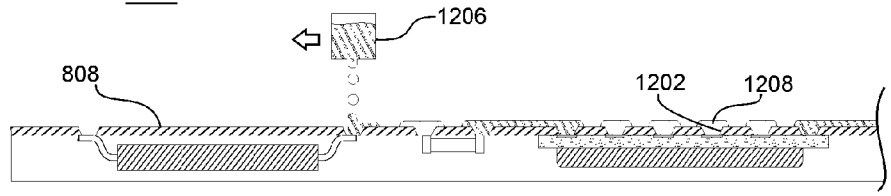
FIG. 12 is a cross-sectional view of a stage in the manufacture of a representative RIP assembly.

FIG. 12, stage 1200, illustrates how direct printing of circuits can be achieved. Vias (e.g., 1202) may be plated or filled with electrically conductive material and traces and leads (e.g., 1208) on substrate 808 may be created by device 1206. Using any number of techniques well known in the art, device 1206 may fill vias 1202, print leads and traces 1208, and/or plate leads and traces 1208 onto substrate 808.

Figure 13:
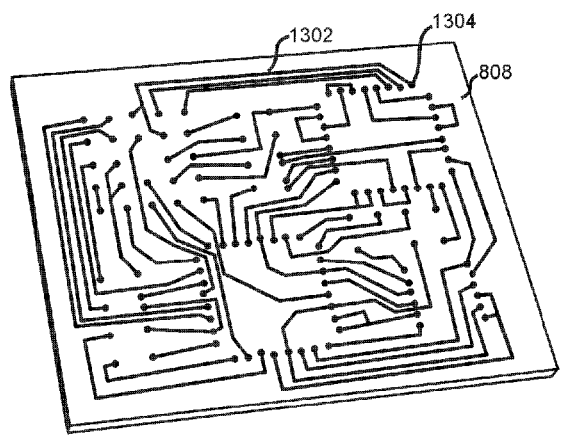
FIG. 13 is a perspective representation of a RIP subassembly.

Traces (e.g., 1302) and leads (e.g. 1304), created in accordance with stage 1200 on substrate 808, are shown in perspective view in FIG. 13, partial apparatus 1300.

Figure 14:
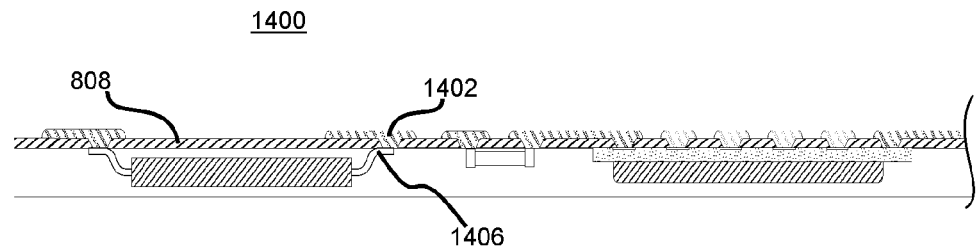
FIG. 14 is a cross-sectional view of a side drawing of a RIP subassembly.

Partial apparatus 1400, created in accordance with stage 1200 is shown in side view in FIG. 14. Filled vias (e.g., via 1402) are shown extending through substrate 808 to component leads (e.g., lead 1406).

Figure 15:
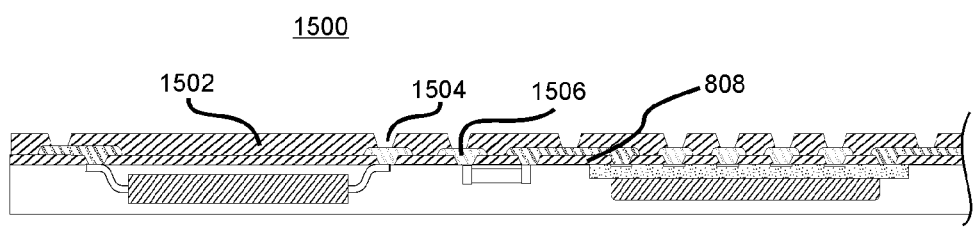
FIG. 15 is a cross-sectional view of a stage in the manufacture of a representative RIP assembly.

In FIG. 15, showing stage 1500, a layer of insulating material 1502 and a second set of vias (e.g. via 1504) are formed on top of substrate 808. The vias extend to and expose leads (e.g., 1506) on top of substrate 808.

Figure 16:
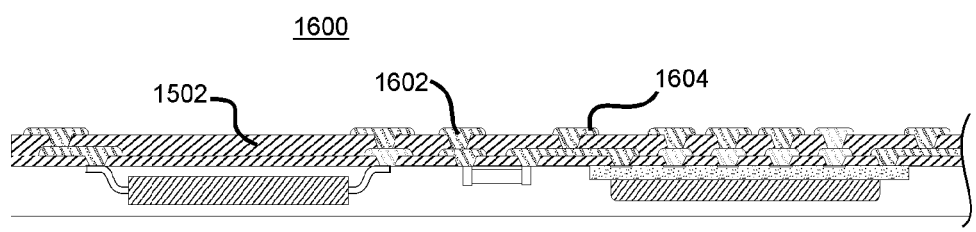
FIG. 16 is a cross-sectional view of shows a stage in the manufacture of a representative RIP assembly.

In FIG. 16, a stage showing creation of subassembly 1600, plating and/or filling vias (e.g., 1602) and making traces (e.g., 1604) are completed on layer 1502.

Figure 17:
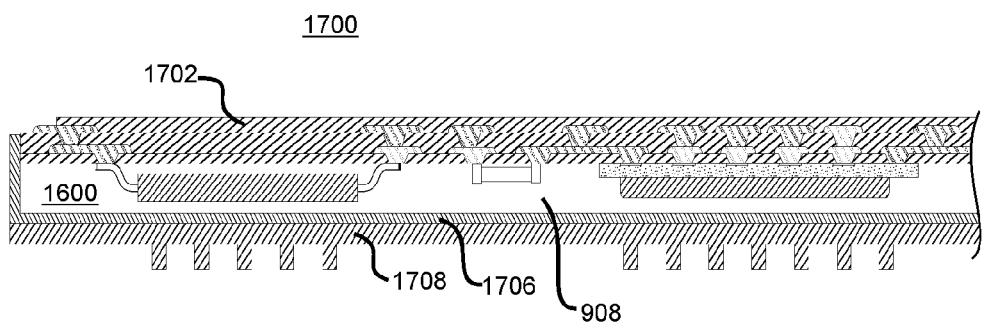
FIG. 17 is a cross-sectional view of a stage in the manufacture of a representative RIP assembly.

In this manner, additional layers may be built up. Eventually, as shown in FIG. 17, stage 1700, insulating material 1702 is laid on top of the top layer of subassembly 1600. In addition, heat spreader 1706 and heat sink 1708 may be attached underneath material 908.

Figure 18:
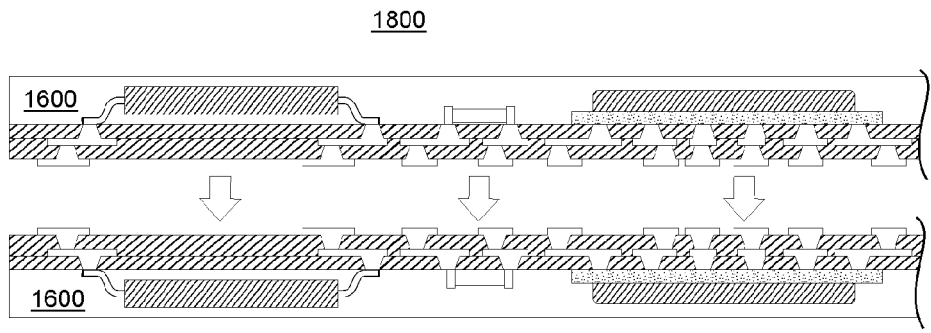
FIG. 18 is a cross-sectional view of the registration and bringing together of two RIP subassemblies.
Figure 19:
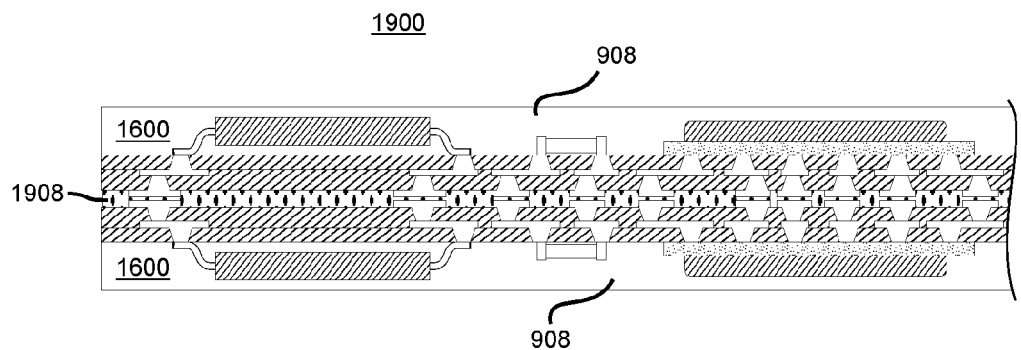
FIG. 19 is a cross-sectional view of a completed mated pair of two RIP subassemblies.

An alternative to laying material 1702 on top of subassembly 1704 is shown in FIG. 18, stage 1800, and FIG. 19, stage 1900. In FIG. 18, the leads, fills, and traces of subassemblies 1600 are registered with each other and then brought together.

FIG. 19 shows the addition of a bonding agent 1908, using any suitable process and material (e.g., applying anisotropic conductive film), joining together subassemblies 1600. As described above and shown in FIG. 17 for one subassembly, but not shown in FIG. 19, heat spreaders and heat sinks may be added underneath support material 1904 and on top of support material 1906.

Figure 20:
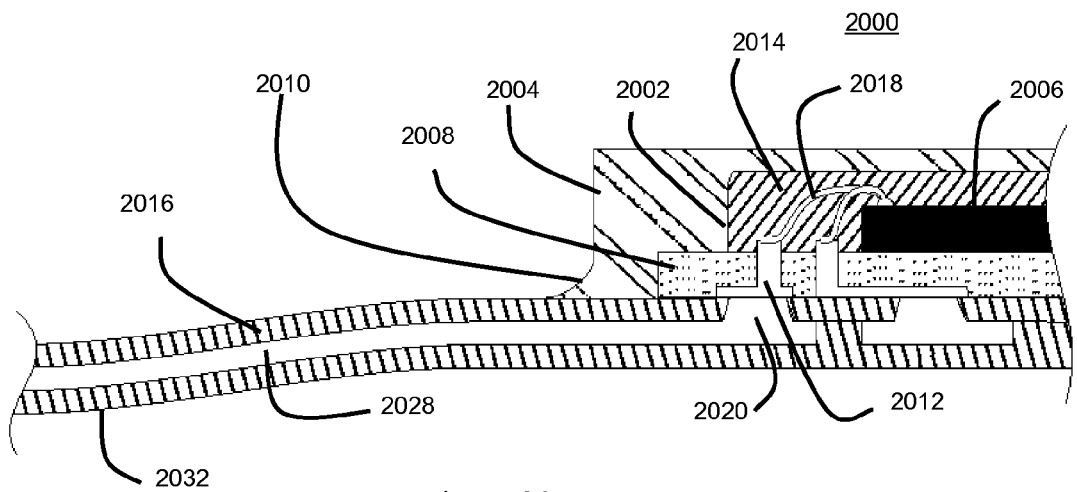
FIG. 20 is a cross-sectional view of a portion of a RIP assembly employing a LGA IC package mounted on a flexible substrate.

FIG. 20 is similar to FIG. 4 with several notable differences: assembly 2000, shown partially, includes flexible substrate 2016, electrically insulating material encapsulant 2004 not extending across the entire flexible substrate 2016, and one layer of vias (e.g. via 2020) and traces (e.g. trace 2028).

FIG. 20, showing an assembly 2000 illustrative of a flexible variant of the present invention, shows an electrical component known as a LGA integrated circuit (IC) package 2002 (including IC component 2006, base substrate 2008, conductive pathway (lead or via) 2012, and insulating material 2014) mounted on a flexible substrate 2016 made of any suitable electrically insulating material. It will be obvious to one skilled in the art that a BGA, gull wing, IC package (including a flip chip), analog, or any type of discrete component may substitute for the LGA IC package 2002.

Assembly 2000, similar to the assembly shown in FIG. 4, is simpler, solder free, and lower profile than the assemblies shown in FIGS. 1, 2, and 3.

Adhering to package 2002 is electrically insulating material encapsulant 2004 shown attached to 2 sides of package 2002. However, encapsulant 2004 may alternatively be attached to one side of package 2002, more than two sides of package 2002, or may in fact envelop package 2002. As applied, encapsulant 2004 may give an appropriate portion of the assembly strength, stability, structural integrity, toughness (i.e., it is non-brittle), and dimensional stability. Encapsulant 2004 may be reinforced by the inclusion of a suitable material such as a glass cloth or other filler material or, as discussed below (FIGS. 29 and 30), it may be flexible itself.

While package 2002, as manufactured and shipped in many cases, incorporates insulating material 2014, the material 2014 is a legacy feature that at some point may be eliminated thus reducing the profile of the assembly 2000. In fact, material 2014 may currently be eliminated, if package 2002 is a flip chip design. Base substrate 2008, if present, and adhesive material (not shown) sit on flexible substrate 2016 which is preferably made of insulating material. Some portion or all of flexible substrate 2016 may be made of electrically conductive material if it is desired to short leads (e.g., conductive pathway 2012) extending from package 2002.

A set of vias, an example of which is via 2020, extends through flexible substrate 2016, extends through base substrate 2008, if present, reaches, and exposes leads such as conductive pathway 2012. However, conductive pathway 2012 may itself be a via, in which case the combination of via 2020 and conductive pathway 2012 extend to a wire bond 2018.

Package 2002 may be attached to flexible substrate 2016 by adhesive dots as well as by other well known techniques. Also adhering to flexible substrate 2016 is encapsulant 2004. Optimally, but not essentially, encapsulant 2004 may taper, at taper 2010, to provide strain relief.

Via 2020 is plated or filled with an electrically conductive material (in many cases copper (Cu), although silver (Ag), gold (Au), or aluminum (Al) as well as other suitable materials, may be substituted). The plate or fill fuse with leads such as conductive pathway 2012 forming an electrical and mechanical bond. If conductive pathway 2012 is itself a via, the plate or fill material continues on to fuse with wire bond 2018.

The flexible substrate 2016 may include a pattern mask (not shown) which is plated, or the plate or fill introduced into the set of vias (e.g., via 2020) may extend under the flexible substrate 2016 and provide a required set of traces. Other traces may be created.

A flexible surface electrically insulating material 2032 undercoats traces (e.g. trace 2028) and flexible substrate 2016. Trace 2028 may connect to leads or electrical connectors which may in turn extend beyond the insulating material 2032 similar in manner to that shown in FIG. 4. That is, traces, leads, or electrical connectors, similar to lead 434, may extend beyond the insulating material 2032, in a manner similar to the extension of lead 434 beyond material 432. This provides contact surfaces similar to the one shown in FIG. 4 (e.g., surface 436) to permit connection with other electrical components or circuit boards.

Although not shown in FIG. 20, it is apparent from comparing FIG. 20 to FIG. 5, that assembly 2000 may include optional heat dissipation features. Assembly 2000, may have on top of the package 2002 and encapsulant 2004 a heat spreader 506 and/or a heat sink 508 (both shown in FIG. 5) to dissipate heat generated by IC component 2006. A thermal interface material (not shown) may be used to join the heat sink to the heat spreader. Optionally, encapsulant 2004 may include in its composition a heat conductive (although electrically insulating) material such as silicon dioxide ($SiO_2$) or aluminum dioxide ($AlO_2$) to enhance heat flow from package 2002. If heat spreader 506 and heat sink 508 are made of one or more substances well known in the art, they may provide electromagnetic interference (EMI) protection to the assembly 2000 and help protect against static electricity discharges.

FIGS. 21 to 26 show a method of manufacture of a flexible RIP assembly. It will be apparent to one skilled in the art that the sequence of steps may be varied without departing from the scope and spirit of this invention.

Figure 21:
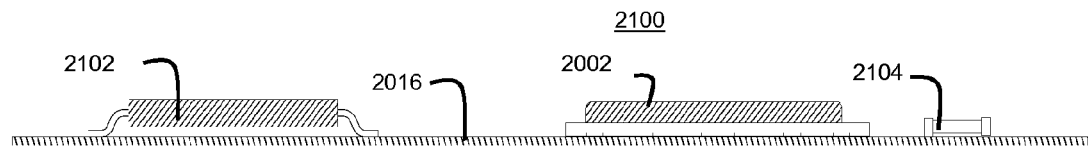
FIG. 21 is a cross-sectional view of a stage in the manufacture of a representative flexible substrate RIP assembly.

FIG. 21, stage 2100, shows the initial mounting of a representative set of electrical components (e.g. gull wing discrete component 2102, package 2002, and analog component 2104) being mounted on flexible substrate 2016. At this stage, flexible substrate 2016 preferably rests on a temporary base (not shown) which could be ice or an air cushion. The components may be held in place by a number of different techniques and/or substances well known in the art including applying spot or conductive adhesive or by bonding to a tacky film of component leads to flexible substrate 2016. The material for applying or bonding may be suitable for holding and later releasing the components.

Figure 22:
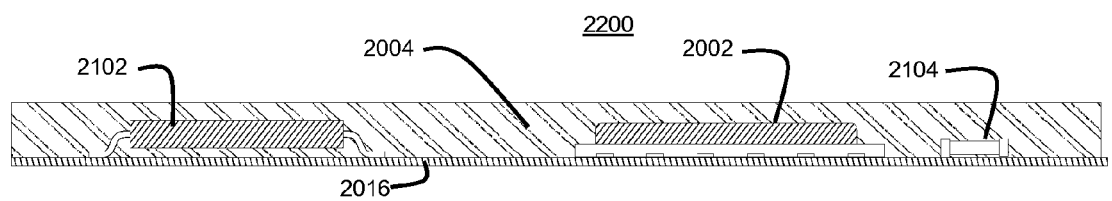
FIG. 22 is a cross-sectional view of a stage in the manufacture of a representative flexible substrate RIP assembly.

FIG. 22, stage 2200, shows applying electrically insulating encapsulant 2004 to encapsulate component 2102, package 2002, and component 2104. Encapsulant 2004 adheres to flexible substrate 2016.

Figure 23:
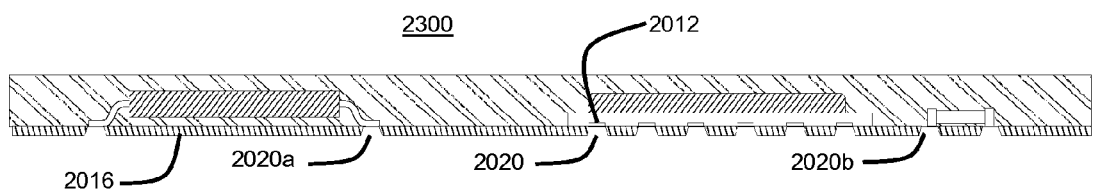
FIG. 23 is a cross-sectional view of a stage in the manufacture of a representative flexible substrate RIP assembly.

In FIG. 23, stage 2300 shows drilling (forming vias 2020a, 2020, and 2020b), through flexible substrate 2016 exposing leads or vias (such as conductive pathway 2012). However, the order and process of forming vias may be different; they may be pre-formed by drilling or molding, for example, before stage 2100, FIG. 21. In fact, vias may be formed by drilling through the temporary base or air cushion.

Figure 24:
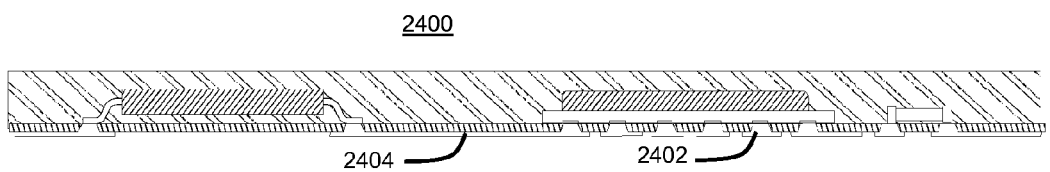
FIG. 24 is a cross-sectional view of a stage in the manufacture of a representative flexible substrate RIP assembly.

At stage 2400, FIG. 24, plating or filling vias occurs with, for example, material 2402. Material 2402, which may be electrically conductive (in many cases copper (Cu), although silver (Ag), gold (Au), or aluminum (Al) as well as other suitable materials that may be substituted), is applied by any process well known in the art. Plate or fill fuse with component leads forming an electrical and mechanical bond. Also at this stage, traces are formed, such as trace 2404, generally in practice by plating.

Figure 25:
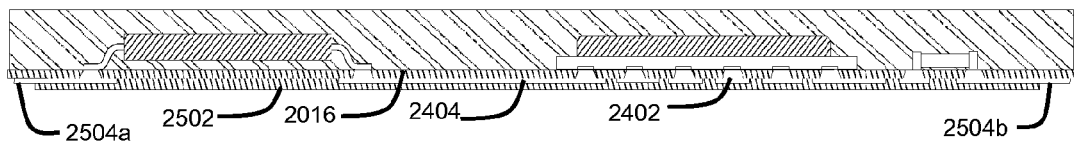
FIG. 25 is a cross-sectional view of a stage in the manufacture of a representative flexible substrate RIP assembly.

At the next stage 2500, FIG. 25, applying a flexible electrically insulating or dielectric material 2502 undercoats plated or filled vias (e.g. via filled with material 2402), traces (e.g. trace 2404), and flexible substrate 2016. Trace, lead, or electrical connector elements 2504a at one point and trace, lead, or electrical connector elements 2504b at another point, may extend beyond the material 2502. Elements 2504a and 2504b allow connection with other electrical components or circuit boards.

Figure 26:
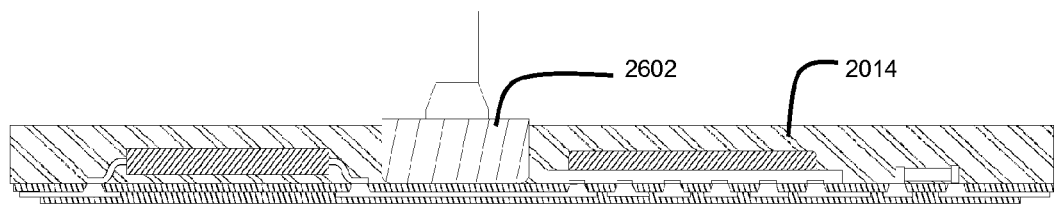
FIG. 26 is a cross-sectional view of a stage in the manufacture of a representative flexible substrate RIP assembly.

At stage 2600, FIG. 26, which may be performed out of order, encapsulant 2004 may be extracted (i.e., material removed), for example by a machine tool 2602, such as a milling or a routing tool, to expose a surface of the flexible substrate 2016 of the assembly. Other techniques of material removal such as laser, mechanical, or chemical ablation may be employed. However, if encapsulant 2004 is itself sufficiently flexible, and a bend to be applied is not so extreme as to excessively strain and stress fracture circuits, traces, leads, or electrical connectors, encapsulant 2004 need not be extracted completely to the surface of flexible substrate 2016.

Figure 27:
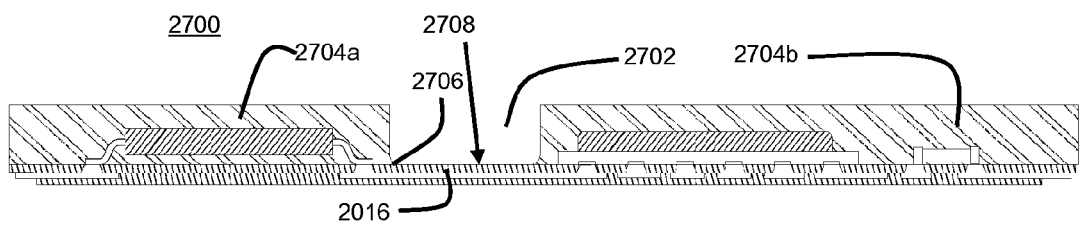
FIG. 27 is a cross-sectional view of a representative RIP assembly showing discrete, LGA IC package and analog components mounted on a flexible substrate.

FIG. 27, shows RIP assembly 2700 after stage 2600. Exposed is the surface of flexible substrate 2016 forming a thin central area 2708. A gap or cavity 2702 has been formed in the assembly 2700 where the assembly 2700 can be flexed. Encapsulant portions 2704a and 2704b on either side of gap 2702 house components. It is preferable, but not essential, for transitions from portions 2704a and 2704b to flexible substrate 2016 be provided with a transition radius or tapered, at taper 2706, to mitigate the potential for a stress riser when the assembly 2700 is bent or shaped.

Figure 28:
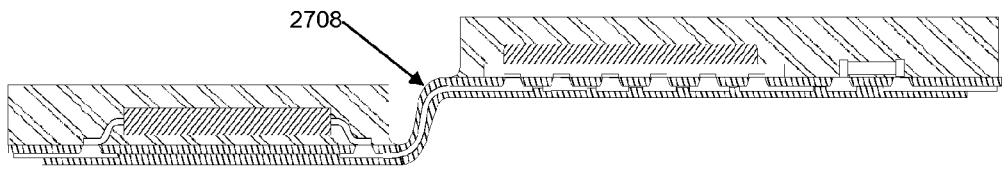
FIG. 28 is a cross-sectional view of a representative RIP assembly showing mounted discrete, LGA IC package, and analog, components on a flexible substrate and showing a flexing of the assembly.

FIG. 28 shows assembly 2700 with the thin central area 2708 flexed. Flexing a RIP assembly allows it to be placed in devices where "real estate" is at a premium (e.g., cell phones and hand held devices) thus allowing assembly 2700 and circuitry to be inserted around other miscellaneous device elements and may in fact be made an integral element of the final assembly such as an interface including a keyboard and the like.

Figure 29:
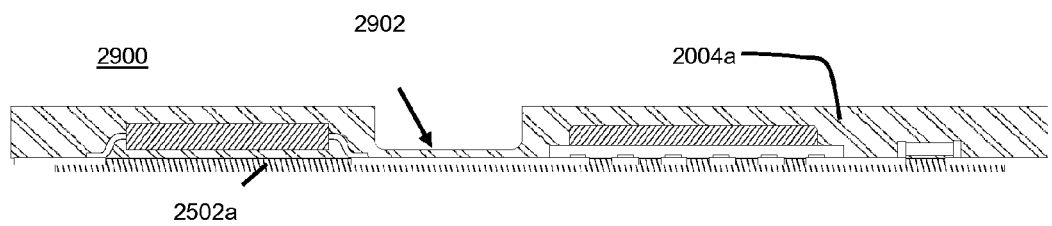
FIG. 29 is a cross-sectional view of a representative RIP assembly showing discrete, LGA IC package, and analog components mounted without a flexible substrate.

FIG. 29 illustrates an alternative embodiment of a RIP assembly, assembly 2900, wherein the flexible substrate 2016 (FIG. 27) is not used and where electrically insulating material flexible encapsulant 2004a is used in its place to support the components. Instead of being attached to the flexible substrate 2016, components are placed on a temporary substrate and flexible encapsulant 2004a applied. When the temporary substrate is removed, component leads are exposed on a surface of the flexible encapsulant 2004a. Traces may be formed by plating and a surface electrically insulating or dielectric material 2502a applied underneath traces and encapsulant 2004a. At some point in the process, a portion of flexible encapsulant 2004a may be extracted, for example by a machine tool 2602, such as a milling or a routing tool, leaving a thin layer of flexible encapsulant 2004a covering the material 2502a, as well as interlayering any traces, leads, or electrical connectors, and forming a thin central area 2902.

Comparing this embodiment to assembly 2700 and process steps forming assembly 2700, as shown in FIGS. 21 to 27, FIG. 29 indicates the omission of flexible substrate 2016 on which component 2102, package 2002, and component 2104 are placed. Instead, component 2102, package 2002, and component 2104 were placed on a temporary substrate which was removed after encapsulating component 2102, package 2002, and component 2104. Because a supporting flexible substrate is not present, it is evident that drilling or molding vias are not required.

Figure 30:
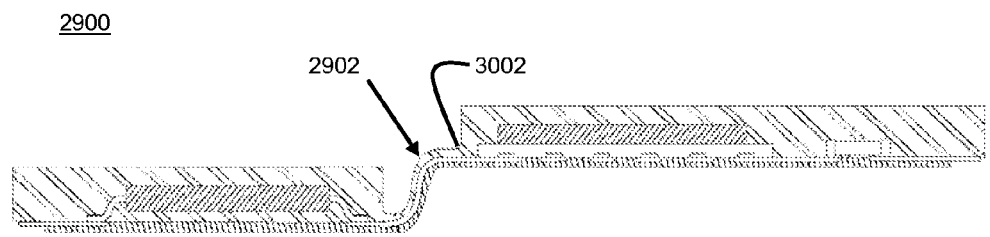
FIG. 30 is a cross-sectional view of a representative RIP assembly showing discrete, LGA IC package, and analog components mounted without a flexible substrate and showing a flexing of the assembly.

In a manner similar to that shown in FIG. 28, assembly 2900 in FIG. 30 can be flexed at thin central area 2902. Likewise, a transition from flexible encapsulant 2004a to cover insulating layer 2502a can be tapered at taper 3002.

While only one RIP layer is shown in the FIGS. 20 through 30, it will be obvious to those skilled in the art that additional build up layers of circuitry can be created as required to make all connections needed for the circuit assembly.

In addition, while the conductive pathways illustrated and described have been shown to be comprised primarily of electrically conductive metals, it is within the scope of this invention that at least some conductive pathways used as circuits can be comprised of materials which conduct light for optical interconnections between various components in the assembly and to and from the assembly itself. This can be accomplished by the use of suitable optical polymers deposited in surface channels or light wave guides in optical backplanes or by embedding optical fibers.

While the particular system, apparatus, and method for FLEXIBLE CIRCUIT ASSEMBLIES WITHOUT SOLDER AND METHODS FOR THEIR MANUFACTURE as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular means "at least one". All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims.

I claim:

1. A circuit assembly comprising:
   a flexible substrate having a first and a second side;
   at least two electrical components, each with a conductive pathway;
   each electrical component located on the first side the flexible substrate and in direct physical contact with the first side;
   an electrically insulating material encapsulate attached to at least one side of the component;
   the encapsulate attached to the first side of the flexible substrate with no encapsulate between the at least two components and the flexible substrate;
   a via extending through the flexible substrate to the conductive pathway of each component;
   an extraction extending through the encapsulate to a level proximate to a first side of the flexible substrate defining gap in the encapsulate between the at least two electric components, the gap selectively permitting the flexible substrate to flex in the region of the gap;
   each via having an inclusion of electrically conductive non solder material, the non solder material in electrical communication with the conductive pathway of each said at least two electrical components;
   at least one trace formed on the second side of the flexible substrate interconnecting the non solder electrically conductive material of the vias of the at least two components; and
   said at least one trace covered with an electrically insulating material.

2. The assembly of claim 1 wherein at least one of the electrical components is an electro-optical component.

3. The assembly of claim 2 wherein the conductive pathway is disposed to conduct signals by light.

* * * * *